United States Patent
Kim et al.

(10) Patent No.: US 6,626,995 B2
(45) Date of Patent: Sep. 30, 2003

(54) SUPERCONDUCTOR INCORPORATING THEREIN SUPERCONDUCTIVITY EPITAXIAL THIN FILM AND MANUFACTURING METHOD THEREOF

(75) Inventors: Jun Ho Kim, Jinju-Si (KR); Sang Hyeob Kim, Keumsan-Gun (KR); Gun Yong Sung, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 14 days.

(21) Appl. No.: 09/994,609

(22) Filed: Nov. 28, 2001

(65) Prior Publication Data

US 2002/0189533 A1 Dec. 19, 2002

(30) Foreign Application Priority Data

Jun. 1, 2001 (KR) .......................... 2001/30890

(51) Int. Cl.$^7$ ............................................. C30B 25/02
(52) U.S. Cl. ......................................... 117/101; 117/84
(58) Field of Search .................................. 117/84, 101

(56) References Cited

PUBLICATIONS

Jung, et al., Temperature– and magnetic field–dependent resistivity . . . , Mar. 2001, Physica C 353 (2001), p. 162–166.

Nagamatsu, et al., Superconductivity at 39K . . . , Mar. 2001, Nature, vol. 410, p. 63–64.

Lapertot, et al., Boron Isotope Effect in Superconducting MgB2, Feb., 2001, Physical Review Letters, vol. 86, No. 9, p. 1877–1879.

Canfield, et al., Superconductivity in Dense MgB2 Wires, Mar. 2001, Phisical Review Letters, vol. 86, No. 11, p. 2423–2426.

*Primary Examiner*—Felisa Hiteshew
(74) *Attorney, Agent, or Firm*—Jacobson Holman PLLC

(57) ABSTRACT

The present invention utilizes magnesium diboride ($MgB_2$) or $(Mg_{1-x}M_x)B_2$ as a superconductivity thin film which can be applied to a rapid single flux quantum (RSFQ) circuit. A method for manufacturing a superconductor incorporating therein a superconductivity thin film, begins with preparing a single crystal substrate. Thereafter, a template film is formed on top of the substrate, wherein the template has a hexagonal crystal structure. The superconductivity thin film of $MgB_2$ or $(Mg_{1-x}M_x)B_2$ is formed on top of the template film. If Mg amount in the superconductivity thin film is insufficient, Mg vapor is flowed on the surface of the superconductivity thin film while a post annealing process is carried out at the temperature ranging from 400° C. to 900° C.

15 Claims, 7 Drawing Sheets

MgB₂ + Mg

US 6,626,995 B2

SUPERCONDUCTOR INCORPORATING THEREIN SUPERCONDUCTIVITY EPITAXIAL THIN FILM AND MANUFACTURING METHOD THEREOF

FIELD OF THE INVENTION

The present invention relates to a superconductor; and, more particularly, to a superconductor incorporating therein an intermetallic compound superconductivity epitaxial thin film and a method for manufacturing the same, using a superconductor material such as magnesium diboride ($MgB_2$) or $(Mg_{1-x}M_x)B_2$.

DESCRIPTION OF THE PRIOR ART

In general, a fabrication of a superconductivity thin film has been advanced for tens of years for the purpose of an electronic circuit application. Particularly, the fabrication of the thin film and its application to the electronic circuit has been mainly researched and developed by utilizing niobium (Nb) of a low temperature superconductor and $Y_1Ba_2Cu_3O_{7-x}$ (YBCO) of a high temperature superconductor, wherein a superconductivity transition temperature (Tc) of Nb is 9.2 K. and that of the YBCO is 93 K.

The superconductivity transition temperature (Tc) of a YBCO thin film is higher than Tc, i.e., 77 K., of liquid nitrogen, and an energy gap of the YBCO thin film is greater than that of the low temperature superconductor so that it may be applied to the electronic circuit with a high speed performance. But, the YBCO thin film has a limitation that a uniform junction is too hard in a manufacturing process so that it is difficult to manufacture an integrated circuit (I.C).

On the contrary, Nb of the low temperature superconductor has advantages that the junction process is easy so that it may be applied to the fabrication of the I.C. However, an operation of the I.C is performed at a temperature below than the superconductivity transition temperature of liquid helium (He), i.e., about from 4 K. to 5 K., so that the Nb thin film is less practical in the view point of economy.

In recent years, magnesium diboride ($MgB_2$) is discovered as the superconductor material. The $MgB_2$ is an intermetallic compound superconductor having magnesium (Mg) and boron (B) therein. The composition of the $MgB_2$ is relatively simple and the superconductivity transition temperature is high, i.e., 39 K., so that it can be applied to the electronic circuit in case of fabricating $MgB_2$ as the thin film.

If $MgB_2$ is applied to the electronic circuit, the operation of the circuit can be performed at the temperature ranging from 15 K. to 20 K. using a conventional cryocooler and the speed of the circuit is approximately 4 times as fast as that of an Nb circuit which is operated at the temperature ranging from 4 K. to 5 K. In addition, since an operation temperature of the circuit ranges from 15 K. to 20 K., it is unnecessary to use liquid nitrogen so that it may be widely applied to an electronic device economically.

Up to now, several technologies for $MgB_2$ has been announced such as a fabrication technology of an $MgB_2$ powder, an $MgB_2$ pellet and an $MgB_2$ wire.

Referring to FIGS. 1 and 2 are graphs setting forth a X-ray diffraction pattern and a relation between the resistivity and the temperature of an $MgB_2$ thin film in accordance with a first prior art. According to the first prior art, the method for manufacturing the $MgB_2$ pellet begins with mixing Mg and B to a ratio of 1:2. Thereafter, mixture of Mg and B is pressurized at a high temperature in a hot isostatic pressing (HIP) furnace, thereby obtaining an $MgB_2$ pellet having the superconductivity transition temperature of 39 K. This is disclosed by J. Nagamatsu, N. Nakagawa, T. Muranaka, Y. Zenitani and J. Akimitsu in an article, "Superconductivity at 39 K. in Magnesium Diboride, Nature 410, 63, 2001".

A second prior art for manufacturing the $MgB_2$ pellet is disclosed by C. U. Jung et al., in an article, "Temperature-and-Magnetic-Field-Dependences of Normal State Resistivity of $MgB_2$ Prepared at High Temperature and High Pressure Condition, http://www.lanl.gov/cond-mat/0102215". In a disclosure, $MgB_2$ is fabricated in a type of pellet under the high temperature and the high pressure by using an anvil-typed press.

Furthermore, a third prior art for manufacturing the $MgB_2$ powder is disclosed by S. L. Bud'ko et al., in an article, "Boron Isotope Effect in Supercoducting $MgB_2$, Phys. Rev. Lett., 86, pp. 1,877–1,880, 2001". According to the third prior art, to begin with, mixture of Mg and B is inserted into a tantalum (Ta) tube after Mg and B are mixed to a ratio of 1:2. Thereafter, the Ta tube is vacuum-sealed using a quartz capsule. Finally, the Ta tube provided with mixture of Mg and B therein is annealed at 950° C. and then cooled, thereby obtaining the $MgB_2$ powder.

A fourth prior art for manufacturing the $MgB_2$ wire is disclosed by P. C. Canfield et al., in an article, "Superconductivity in Dense $MgB_2$ wire, Phys. Rev. Lett., 86, pp. 2,423–2,426, 2001". In a paper, boron fiber and Mg are inserted into the Ta tube and the tube is vacuum-sealed using the quartz capsule. Thereafter, it is annealed at 950° C., thereby obtaining the $MgB_2$ wire.

However, it is impossible for the $MgB_2$ powder and pellet and wire fabricated by the prior arts to be applied to the fabrication of the electronic circuit. Thus, a fabrication method for the $MgB_2$ thin film is required to be applied to the electronic circuit.

SUMMARY OF THE INVENTION

It is, therefore, an object of the present invention to provide a superconductor incorporating therein a superconductivity epitaxial thin film of magnesium diboride ($MgB_2$) or $(Mg_{1-x}M_x)B_2$ which can be applied to a rapid single flux quantum (RSFQ) circuit.

It is, therefore, another object of the present invention to provide a method for manufacturing a superconductor incorporating therein a superconductivity epitaxial thin film of $MgB_2$ or $(Mg_{1-x}M_x)B_2$ which can be applied to a rapid single flux quantum (RSFQ) circuit.

In accordance with one aspect of the present invention, there is provided a superconductor comprising: a template film having a hexagonal crystal structure; and a superconductivity thin film formed on top of the template film, including magnesium (Mg) and boron (B) therein which are epitaxially grown up, wherein a crystal structure and a lattice constant of the template film are similar to those of the superconductivity thin film.

In accordance with another aspect of the present invention, there is provided a method for manufacturing a superconductor comprising the steps of: preparing a substrate; b) forming a template film on top of the substrate, wherein the template film has a hexagonal crystal structure; and c) forming a superconductivity thin film on top of the template film having Mg and B therein.

BRIEF DESCRIPTION OF THE DRAWINGS

The above and other objects and features of the present invention will become apparent from the following descrip

DETAILED DESCRIPTION OF THE PREFERRED EMBODIMENTS

Figure 1:
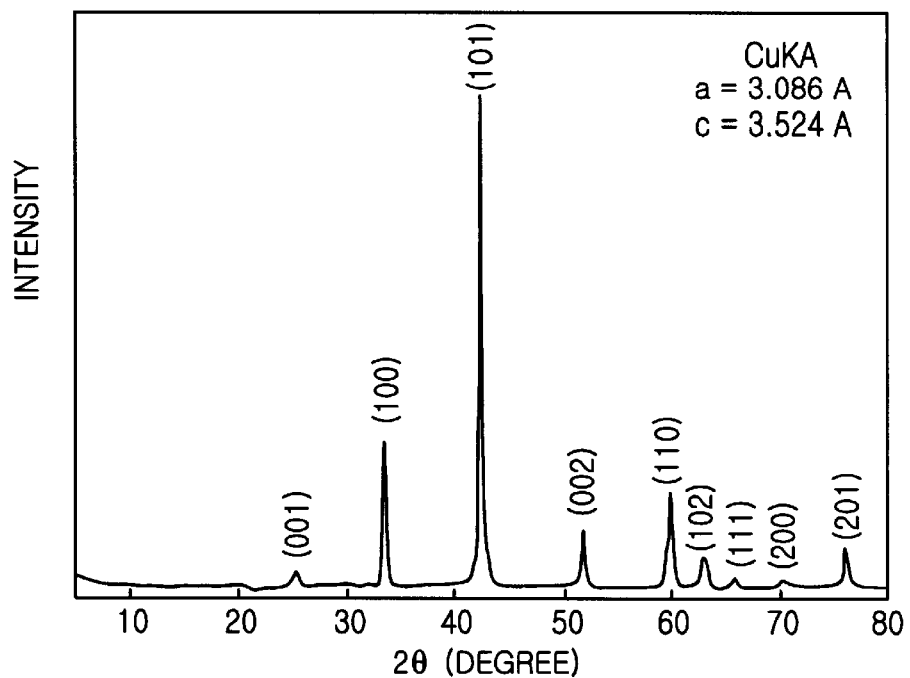
- FIG. 1 is an X-ray diffraction pattern of magnesium diboride ($MgB_2$) pallet in accordance with a prior art.
Figure 2:
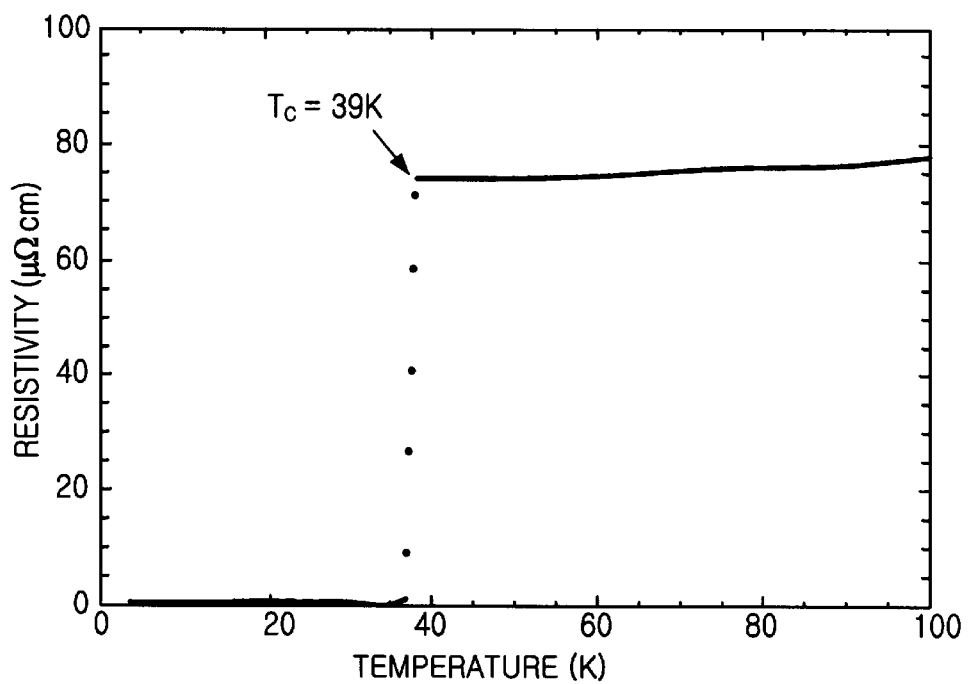
FIG. 2 is a graph setting forth a relation between a resistivity and a temperature of the $MgB_2$ pallet in accordance with the prior art.
Figure 3:
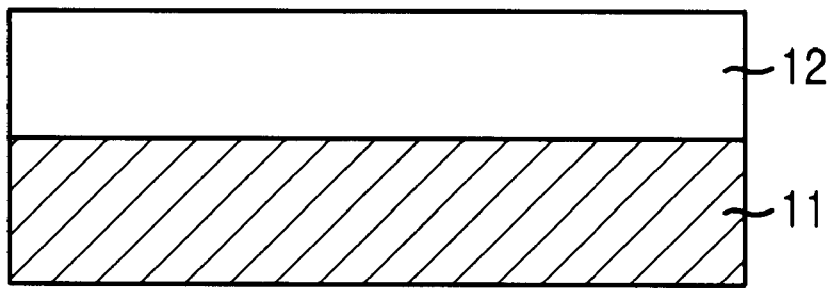
FIG. 3 is a schematic view setting forth an $MgB_2$ thin film or an $(Mg_{1-x}M_x)B_2$ thin film in accordance with a first preferred embodiment of the present invention.

Referring to FIG. 3, there is shown a schematic view setting forth a superconductor incorporating therein a superconductivity epitaxial thin film having magnesium (Mg) and boron (B), in accordance with a first preferred embodiment of the present invention. The superconductor comprises a single crystal substrate 11 having a hexagonal crystal structure and the superconductivity epitaxial thin film 12 formed on top of the single crystal substrate 11.

Here, one of materials may be utilized as the single crystal substrate 11, as described in table 1.

TABLE 1

| Material | Lattice Constant (nm) | Crystal Structure |
| --- | --- | --- |
| GaN | 0.3180 | hexagonal |
| $Al_2O_3$ | 0.24747 | hexagonal |
| SiC | 0.3082 | hexagonal |
| ZnO | 0.3250 | hexagonal |
| $LiAlO_2$ | 0.3134 | tetragonal |
| $LiGaO_2$ | 0.3186 | orthorhombic |

Referring to table 1, if the superconductivity epitaxial thin film 12 is magnesium diboride ($MgB_2$) of which the crystal structure is the hexagonal structure and lattice constant is 0.3086 nm, the material having the crystal structure and the lattice constant similar to those of $MgB_2$, is preferred to be used as the single crystal substrate 11, for example, gallium nitride (GaN), aluminum oxide ($Al_2O_3$), silicon carbide (SiC), zinc oxide (ZnO), $LiAlO_2$, $LiGaO_2$. Here, it is noted that $LiAlO_2$ and $LiGaO_2$ are a tetragonal and an orthorhombic structure respectively. But the lattice constants of $LiAlO_2$ and $LiGaO_2$ are similar to that of $MgB_2$ so that $LiAlO_2$ and $LiGaO_2$ may be used as the substrate for growing up $MgB_2$.

Figure 4:
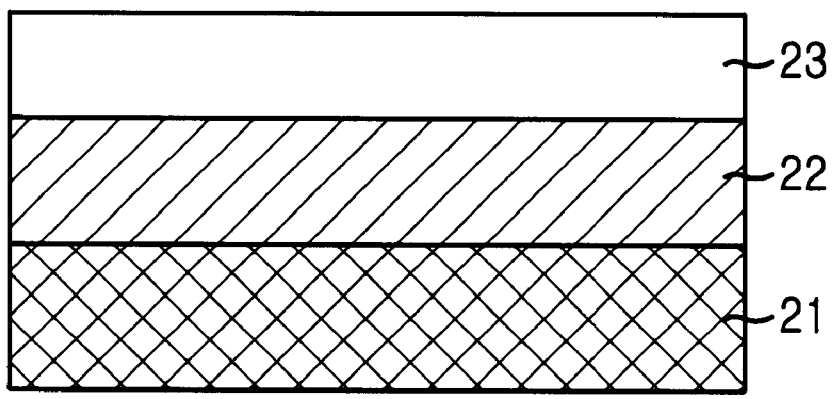
FIG. 4 is a schematic view setting forth the $MgB_2$ thin film or the $(Mg_{1-x}M_x)B_2$ thin film in accordance with a second preferred embodiment of the present invention.

Referring to FIG. 4, there is shown a schematic view setting forth a superconductor incorporating therein a superconductivity epitaxial thin film having Mg and B, in accordance with a second preferred embodiment of the present invention. The superconductor comprises a substrate 21, a template film 22 formed on top of the substrate 21 and the superconductivity epitaxial thin film 23 formed on top of the template film 22. The substrate 21 includes a material such as silicon (Si), gallium arsenide (GaAs), metal, magnesium oxide (MgO) and strontium titanium oxide ($SrTiO_3$). The template film 22 uses $LiAlO_2$, $LiGaO_2$ or the material having the hexagonal crystal structure, wherein the template film 22 is used as a buffer layer or a seed layer. The material having the hexagonal structure is selected from the group including GaN, $Al_2O_3$, SiC and ZnO.

From the first and the second embodiments, it is understood that if material having the crystal structure and lattice constant similar to those of $MgB_2$, is used as the substrate or the template film, $MgB_2$ is epitaxially grown up with ease.

Instead of $MgB_2$ thin film as illustrated in the above embodiments, $(Mg_{1-x}M_x)B_2$ thin film having the hexagonal crystal structure may also be used as the substrate or the template film, wherein M is a material selected from the group including copper (Cu), zinc (Zn), sodium (Na), beryllium (Be) and lithium (Li), and x denotes a rational number ranging from 0 to 1.

A method for manufacturing a superconductivity epitaxial thin film of $MgB_2$ or $(Mg_{1-x}M_x)B_2$, is set forth in detail hereinafter.

To begin with, the $MgB_2$ thin film is formed by using a method such as a sputtering, a pulsed laser deposition, a chemical vapor deposition (CVD), a dual ion beam deposition, an E-beam evaporation or a spin coating technique. In case of using the pulsed laser deposition method, there is an advantage that the thin film having a composition similar to that of the target can be obtained because the superconductivity thin film is deposited after forming Ar-plasma on the surface of the substrate.

The CVD method has the advantage that it is appropriate for a mass production of a large size thin film because stoichiometry of Mg and B can be controlled by adjusting the flow of the carrier gas of Mg-organic material and B-organic material. By using the E-beam evaporation and the dual ion beam deposition, it is possible to obtain a high-grade thin film in a high vacuum state and further to control the stoichiometry of Mg and B independently.

Since the vapor pressure of Mg is high, a stoichiometric $MgB_2$ target or non-stoichiometric $Mg_{1+x}B_2$ target is used for forming the $MgB_2$ epitaxial thin film by using the sputtering, the pulsed laser deposition or the E-beam evaporation method. At this time, the $MgB_2$ target is a pellet-typed target which is made by pressurizing $MgB_2$ powder or pressurizing and heating $MgB_2$ powder at the same time. The $Mg_{1+x}B_2$ target is a sintered material in which Mg is added to $MgB_2$ powder, a mosaic-typed target using an Mg-metal plate and a B-metal plate, or an Mg-charged target in which Mg-metal plate is charged. In case of depositing by using the $Mg_{1+x}B_2$ target, the $Mg_{1+x}B_2$ target plays a role in supplementing insufficient amount of Mg. The $Mg_{1+x}B_2$ target is applied to the sputtering, the pulsed laser deposition or the E-beam evaporation method.

Figure 5A:
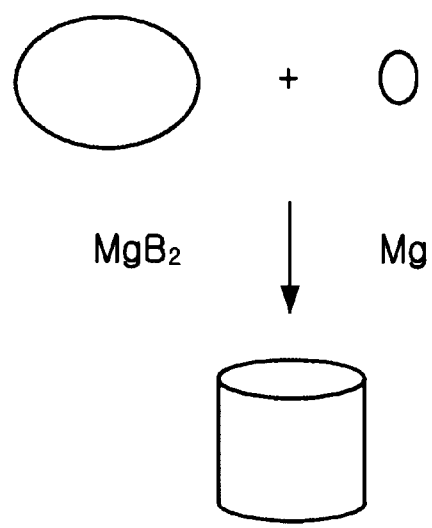
FIGS. 5A to 5C are schematic views illustrating an $Mg_{1+x}B_2$ target in accordance with the first and the second preferred embodiments of the present invention.
Figure 5B:
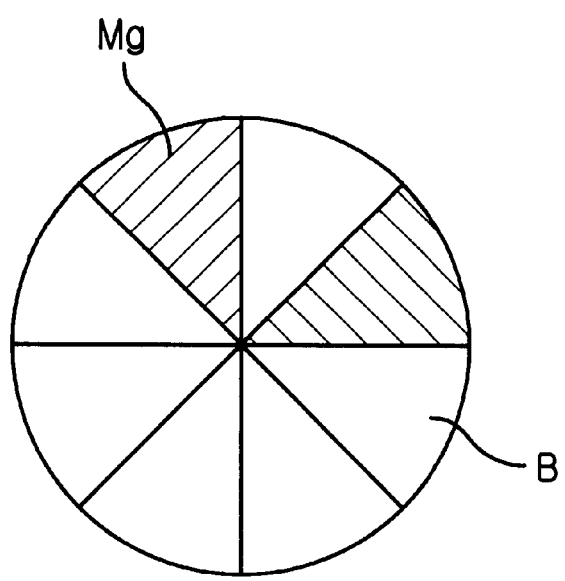
Figure 5C:
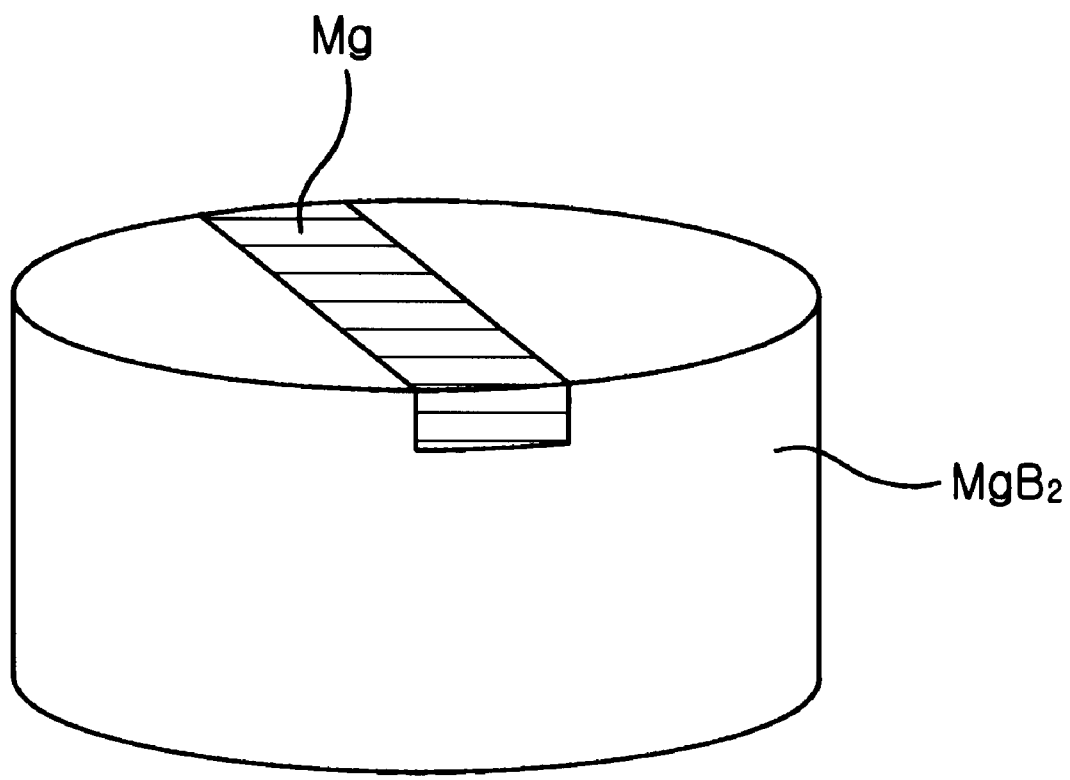
Figure 6A:
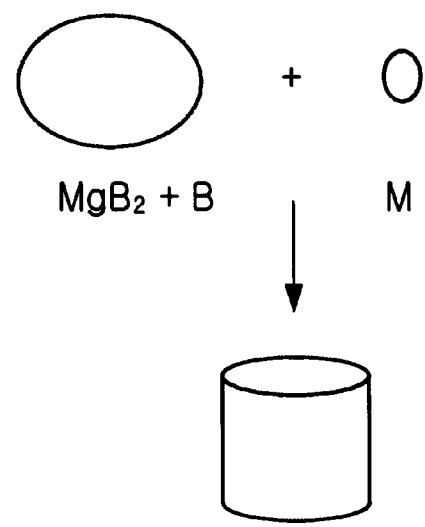
FIGS. 6A to 6C are schematic views of an $(Mg_{1-x}M_x)B_2$ target in accordance with the first and the second preferred embodiments of the present invention.
Figure 6B:
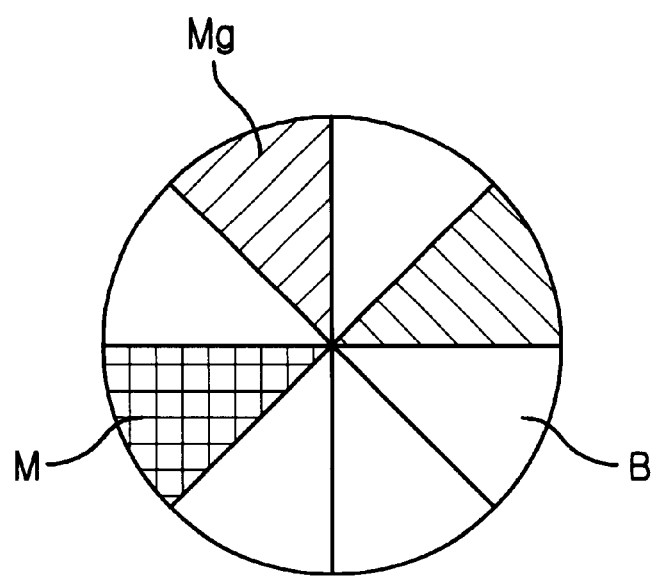
Figure 6C:
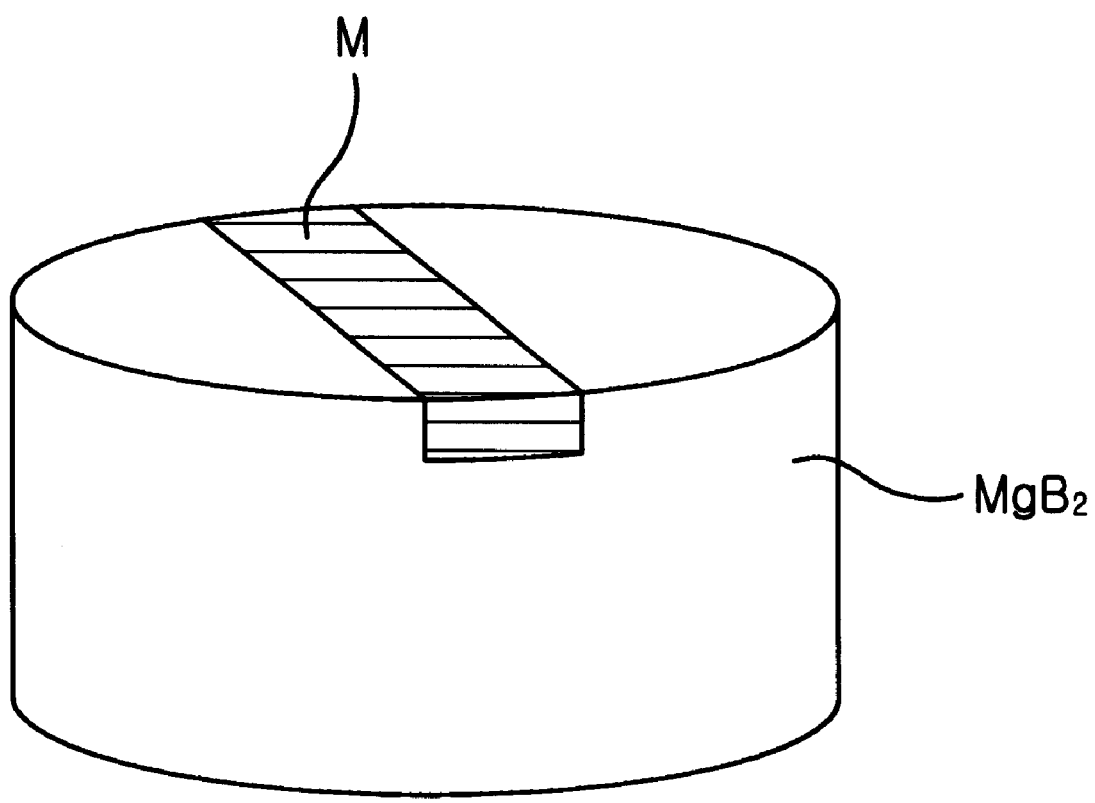

Referring to FIGS. 5A to 5C, there are shown schematic views illustrating the $Mg_{1+x}B_2$ target in accordance with the present invention, wherein FIG. 5A shows the sintered material in which Mg is added to $MgB_2$ powder, FIG. 5B is the mosaic-typed target using an Mg-metal plate and a B-metal plate, and FIG. 5C represents an Mg-charged target in which Mg-metal plate is charged.

Referring to 6A to 6C, there are shown schematic views of an $(Mg_{1-x}M_x)B_2$ target in accordance with the present invention. The $(Mg_{1-x}M_x)B_2$ target is selected from the group including a sintered $(Mg_{1-x}M_x)B_2$ which the mixture of $MgB_2$ powder and M are pressurized and heated, an $(Mg_{1-x}M_x)B_2$ mosaic-typed target using the Mg-metal plate, the B-metal plate and an M-metal plate, an $(Mg_{1-x}M_x)B_2$-charged target which M is supplemented therein. Here, M denotes a material selected from the group including Cu, Zn, Na, Be and Li. The $(Mg_{1-x}M_x)B_2$ target is used for the method such as the sputtering, the pulsed laser deposition or the E-beam evaporation technique.

Figure 7:
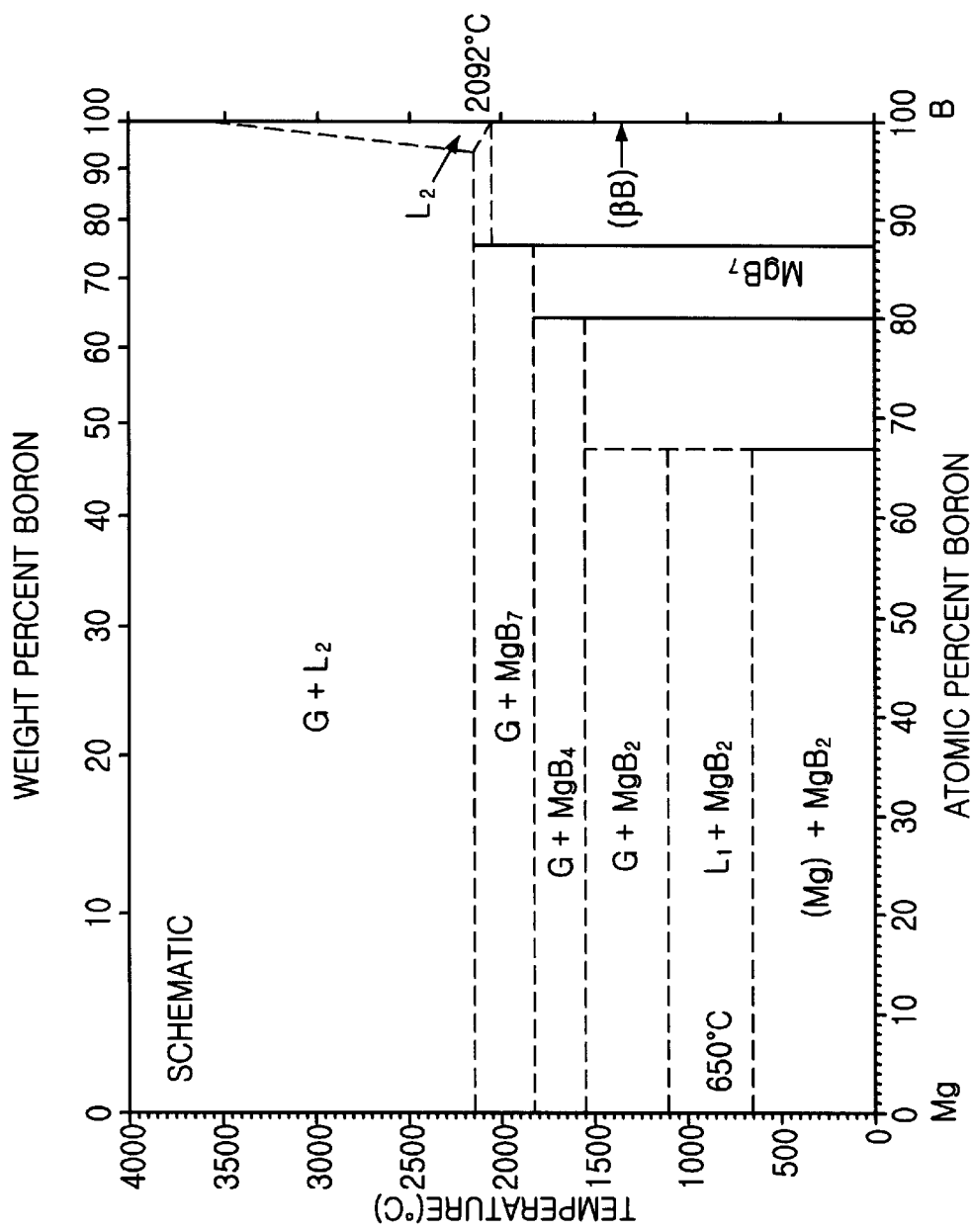
FIG. 7 is a phase diagram of $MgB_2$ in accordance with the first preferred embodiment of the present invention.

Referring to FIG. 7, there is shown a phase diagram of $MgB_2$ in accordance with the present invention.

In order to fabricate the $MgB_2$ epitaxial thin film by using the above method, it is necessary to supply heat energy while the thin film is grown up. Therefore, the substrate is heated up to the temperature ranging from 400° C. to 900° C. where a $L_1+MgB_2$ phase is formed, as shown in FIG. 7.

Furthermore, it is preferable that the deposition of the thin film should be carried out in vacuum state, in argon (Ar) ambient atmosphere, in mixed gas of Ar and hydrogen ($H_2$) ambient atmosphere and in mixture of Ar and water vapor ambient atmosphere.

If the Mg amount of the thin film is insufficient after depositing the thin film, magnesium vapor is flowed on the surface of the thin film for supplementing Mg while a post annealing process is carried out at the temperature ranging from 400° C. to 900° C. The post annealing process should be carried out in the atmosphere without oxygen, such as in vacuum state, in argon (Ar) ambient atmosphere, in mixed gas of Ar and $H_2$ ambient atmosphere and in mixture of Ar and water vapor ambient atmosphere. Mg atoms supplemented during the post annealing process diffuse from the surface of the thin film into an Mg insufficient area, thereby achieving the stoichiometry of $MgB_2$.

Another method for manufacturing the $MgB_2$ epitaxial thin film begins with depositing a boron thin film on the substrate at a room temperature. Thereafter, Mg vapor is flowed on the surface of the boron thin film while the post annealing process is carried out at the temperature in the range of 400° C. to 900° C., thereby obtaining the $MgB_2$ thin film. Otherwise, an amorphous $MgB_2$ thin film is deposited on the substrate at the room temperature and then a passivation film is deposited on the amorphous $MgB_2$ thin film. Subsequently, the annealing process is carried out at the temperature ranging from 400° C. to 900° C., thereby obtaining the $MgB_2$ thin film.

In case of depositing the template film as the buffer layer or the seed layer, the deposition method is used such as the sputtering, the pulsed laser deposition, the CVD, the dual ion beam deposition, the E-beam evaporation or the spin coating technique.

In conclusion, in case of applying the $MgB_2$ or the $(Mg_{1-x}M_x)B_2$ thin film of the present invention to a rapid single flux quantum (RSFQ) circuit, there is an advantage that the operation of the circuit can be performed at the temperature ranging from 15 K. to 20 K. using a conventional cryocooler. Furthermore, there is another advantage that the speed of the circuit is approximately 4 times as fast as that of an Nb circuit which is operated at the temperature ranging from 4 K to 5 K.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a superconductor comprising the steps of:

a) preparing a substrate;
   b) forming a template film on top of the substrate, wherein the template film has a hexagonal crystal structure; and
   c) forming a superconductivity thin film on top of the template film having Mg and B therein.

2. The method as recited in claim 1, wherein the step c) includes the steps of:

c1) depositing a boron thin film on top of the template film; and
   c2) carrying out a post annealing process at a t=<øÓ, øLk ÈÁ+ temperature ranately 400°( C. to approximately) 900° C., while Mg vapor is being flowed on top of the boron thin film.

3. The method as recited in claim 1, wherein the step c) includes the steps of:

c1) depositing an amorphous thin film of $MgB_2$ on top of the template layer;
   c2) depositing a passivation film on top of the amorphous thin film of $MgB_2$ at a temperature below 400° C.; and
   c3) carrying out a post annealing process at the temperature ranging from approximately 400° C. to approximately 900° C.

4. The method as recited in claim 3, wherein the passivation film includes a material selected from the group including MgO, GaN, SiC, ZnO and $Al_2O_3$.

5. The method as recited in claim 1, wherein the substrate is made of a material selected from the group including Si, GaAs, metal, MgO, gallium nitride (GaN), aluminum oxide ($Al_2O_3$), silicon carbide (SiC), zinc oxide (Zno), $LiAlO_2$, $LiGaO_2$, magnesium oxide (MgO) and strontium titanium oxide ($SrTiO_3$).

6. The method as recited in claim 1, wherein the superconductivity thin film is made of a material selected from the group including $MgB_2$ and $(Mg_{1-x}M_x)B_2$, where, M is a material selected from the group including Cu, Zn, Na, Be and Li, and x is a rational number ranging from 0 to 1.

7. The method as recited in claim 6, wherein the $MgB_2$ or the $(Mg_{1-x}M_x)B_2$ is formed by using a method selected from the group including a sputtering, a pulsed laser deposition, a chemical vapor deposition, a dual ion beam deposition, an E-beam evaporation and a spin coating technique.

8. The method as recited in claim 7, wherein the sputtering or the pulsed laser deposition is carried out in an atmosphere selected from the group including vacuum, argon (Ar) ambient, mixed gas of Ar and hydrogen ($H_2$) and mixture of Ar and water vapor.

9. The method as recited in claim 7, wherein a target used for the sputtering, the pulsed laser deposition or the E-beam evaporation technique is a stoichiometric $MgB_2$ target or a non-stoichiometric $Mg_{1+x}B_2$ target, where, x is a rational number that is not a negative number.

10. The method as recited in claim 9, wherein the $MgB_2$ target is a pellet typed target which $MgB_2$ powder is pressurized or a pellet typed target which is heated and pressurized simultaneously.

11. The method as recited in claim 9, wherein the $Mg_{1+x}B_2$ target is selected from the group including a sintered material which Mg is added with $MgB_2$ powder, a mosaic-typed target using an Mg-metal plate and a B-metal plate, and an Mg-charged target in which Mg-metal plate is charged.

12. The method as recited in claim 7, wherein the $(Mg_{1-x}M_x)B_2$ target is selected from the group including a sintered $(Mg_{1-x}M_x)B_2$, a $(Mg_{1-x}M_x)B_2$ mosaic-typed target and a $(Mg_{1-x}M_x)B_2$-charged target.

13. The method as recited in claim 1, after the step c), further comprising the step of carrying out a post annealing process at the temperature ranging from approximately 400° C. to approximately 900° C. while Mg vapor is flowed on the surface of the superconductivity thin film providing that Mg amount in the superconductivity thin film is insufficient.

14. The method as recited in claim 13, the annealing process is carried out in the atmosphere selected from the group including vacuum, Ar ambient, mixed gas of Ar and $H_2$ and mixture of Ar and water vapor.

15. The method as recited in claim 1, wherein the step b) is carried out while the substrate is being heated up to the temperature ranging from approximately 400° C. to approximately 900° C.

* * * * *